United States Patent [19]

Vogel et al.

[11] 4,324,611
[45] Apr. 13, 1982

[54] PROCESS AND GAS MIXTURE FOR ETCHING SILICON DIOXIDE AND SILICON NITRIDE

[75] Inventors: Diane C. Vogel, Fremont; Marian C. Tang, Rodeo; Richard F. Reichelderfer, Castro Valley, all of Calif.

[73] Assignee: Branson International Plasma Corporation, Hayward, Calif.

[21] Appl. No.: 163,386

[22] Filed: Jun. 26, 1980

[51] Int. Cl.³ .................. H01L 21/306; C03C 15/00; C03C 25/06; B44C 1/22
[52] U.S. Cl. .................. 156/643; 156/646; 156/653; 156/657; 156/659.1; 156/345; 204/192 E; 204/298; 252/79.1; 427/39
[58] Field of Search ................ 252/79.1, 79.3; 156/643, 646, 653, 657, 659.1, 661.1, 662, 345; 204/192 EC, 192 E, 298, 164; 427/39, 43.1

[56] References Cited

U.S. PATENT DOCUMENTS

| | | | |
|---|---|---|---|
| 3,940,506 | 2/1976 | Heinecke | 427/38 |
| 4,134,817 | 1/1979 | Bourdon | 204/192 E |
| 4,208,241 | 6/1980 | Harshanger et al. | 156/643 |
| 4,211,601 | 7/1980 | Mogab | 156/643 |

FOREIGN PATENT DOCUMENTS

| | | | |
|---|---|---|---|
| 1538 | 4/1979 | European Pat. Off. | 156/643 |
| 2503 | 6/1979 | European Pat. Off. | |

OTHER PUBLICATIONS

J. Vac. Sci. Technol, vol. 16, No. 2, Mar./Apr. 1979, Plasma etching-A Discussion of Mechanisms by Coburn et al., pp. 391-403.
IBM Research Report, RJ 2327 (31269) 9/8/78, Some Chemical Aspects of the Fluorocarbon Plasma Etching of Silicon and Its Compounds by J. W. Coburn et al., pp. 1-31.
J. Appl. Phys. vol. 49, No. 7, Jul. 1978, Additions to CF4 Plasma by C. J. Mogab et al., pp. 3796-3803.
Research Disclosure, Sep. 1977, Sloped Polycrystalline etch by Anon, pp. 78-80.
IBM Technical Disclosure Bulletin, vol. 20, No. 4, Sep. 1977, Plasma Etching of $SiO_2$/Polysilicon Composite Film by H. A. Clark, p. 1386.
Solid State Technology, May 1976, A Survey of Plasma-Etching Processes by R. L. Bersin, pp. 31-36.

*Primary Examiner*—William A. Powell
*Attorney, Agent, or Firm*—Flehr, Hohbach, Test, Albritton & Herbert

[57] ABSTRACT

Process and gas mixture for etching silicon dioxide and/or silicon nitride in a plasma environment in a planar reactor. The gas mixture comprises a primary etching gas and a secondary gas which controls the selectivity of the etch. The process is carried out at relatively high pressure and power levels and provides substantially faster removal of silicon dioxide and/or silicon nitride than has heretofore been possible in planar reactors.

13 Claims, 1 Drawing Figure

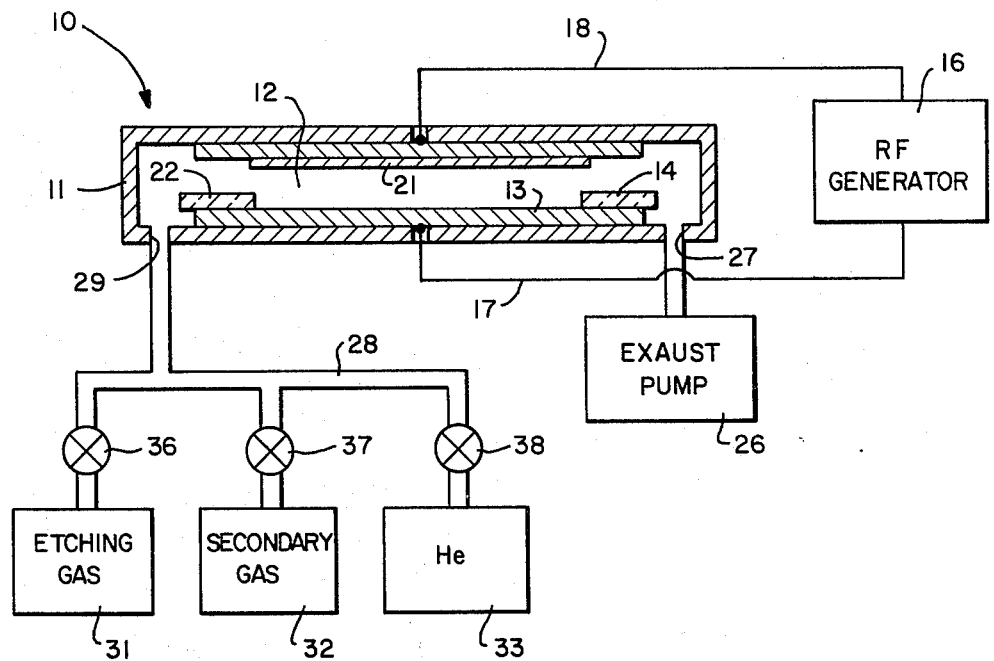

PROCESS AND GAS MIXTURE FOR ETCHING SILICON DIOXIDE AND SILICON NITRIDE

This invention pertains generally to etching processes and gases and more particularly to a process and gas mixture for etching silicon dioxide and/or silicon nitride in a plasma environment.

In a planar plasma reactor, the material to be processed is positioned between a pair of electrode plates which are energized with radio frequency power to ionize a reagent gas and form active species for carrying out the desired process. Such reactors are utilized, for example, for etching silicon, silicon dioxide, silicon nitride and other materials in the fabrication of semiconductor devices.

Heretofore, plasma etching processes have been carried out at relatively low pressures (e.g. 100-600 microns) in planar reactors. With higher pressures, it is difficult to strike and maintain the plasma, and photoresist masking tends to break down. Silicon dioxide and silicon nitride are typically etched in such systems at a relatively slow rate, e.g. 1500 angstroms/minute. It is in general an object of the invention to provide a new and improved process and gas mixture for etching silicon dioxide and/or silicon nitride in a plasma reactor.

Another object of the invention is to provide a process and gas of the above character which are capable of removing silicon dioxide and silicon nitride more rapidly then conventional techniques, without photoresist breakdown.

Another object of the invention is to provide a process and gas mixture of the above character utilizing higher pressures and power densities than conventional etching processes in planar reactors.

These and other objects are achieved in accordance with the invention by employing a gas mixture comprising a primary etching gas consisting of a pure carbon-fluorine gas, and a secondary gas containing hydrogen to control the selectivity of the etch. The wafer to be etched is to be placed between the electrodes of the reactor, the primary gas is admitted at pressure on the order of 1-3 torr, and the secondary gas is admitted at a pressure on the order of 0.5-1.5 torr. A third gas is introduced to prevent breakdown of photoresist on the wafer. A ring of dielectric material is positioned between the wafer and one of the electrodes to enhance concentration of the plasma in the region between the electrodes.

The single FIGURE of drawings is a schematic illustration of one embodiment of apparatus for carrying out the process of the invention.

As illustrated in the drawing, the process is carried out in a planar reactor 10 having housing 11 defining a reaction chamber 12. The housing is provided with a suitable access door (not shown) through which wafers or other materials to be etched are introduced into and removed from the chamber.

The reactor also includes a pair of planar electrodes 13, 14 which are spaced apart in a generally parallel relationship within the chamber. In one presently preferred embodiment, the electrodes are circular plates having a diameter on the order of $3\frac{1}{2}$-$4\frac{1}{2}$ inches, and they are spaced on the order of 0.1-0.5 inch apart. The electrodes are energized by a radio frequency generator 16 which is connected to the electrodes by leads 17, 18. The generator operates at a suitable frequency (e.g. 13.56 MHz) and delivers a power output on the order of 100-1000 watts to produce an electric field for ionizing the gas and forming a plasma in the region between the electrodes. During operation of the reactor, the electrodes are maintained at a temperature on the order of 5°-20° C. by coolant circulating through passageways (not shown).

A wafer 21 to be processed is positioned between the electrodes, and in the embodiment illustrated, this wafer is mounted on the bottom surface of upper electrode 14. The wafer is secured to the electrode by a vacuum chuck or other suitable means. A ring 22 of quartz or other suitable dielectric material is positioned between the wafer and lower electrode 13. This ring serves to enhance the concentration of the plasma in the region between the electrodes. In the embodiment illustrated, the dielectric ring rests on the upper surface of the lower electrode, and it has an outside diameter slightly greater than the diameter than the electrode and inside diameter slightly greater than the diameter of the wafer.

An exhaust pump 26 is connected to an exhaust port 27 for removing gases from the reactor chamber and maintaining the desired level of pressure within the chamber. In the embodiment illustrated, gas is supplied to the chamber through a manifold 28 connected to an inlet port 29. However, the gas can be introduced by any suitable means, and in one presently preferred embodiment, one of the electrodes is fabricated of a porous material and the gas is introduced through the electrode and diffused directly into the region between the electrodes, as described in detail in copending application Ser. No. 151,169, filed May 19, 1980.

The reagent gas comprises a mixture of a primary etching gas and a secondary gas for controlling the selectivity of the etch, i.e. the relative etching rates of the $SiO_2$ and/or $Si_3N_4$ and silicon. With some primary and secondary gases, a third gas containing helium is included in the mixture to prevent the breakdown of photoresist on the wafer. As illustrated in the drawing, the gases are supplied by an etching gas source 31, a secondary gas source 32, and a third gas source 33. The delivery of gas to the chamber is controlled by flow control valves 36-38.

In one presently preferred embodiment for etching silicon dioxide and/or silicon nitride, the primary gas consists of $C_2F_6$ at a pressure on the order of 2.5 torr, the secondary gas consists of $CHF_3$ at a pressure on the order of 1.3 torr, and helium at a pressure on the order of 5 torr is included to prevent photoresist breakdown. The wafer to be etched is placed in the reactor chamber, and the chamber is evacuated by means of exhaust pump 26. The $C_2F_6$ is admitted to the chamber to bring the chamber pressure up to 2.5 torr, then the $CHF_3$ is admitted to bring the pressure to 3.5 torr, and the helium is admitted to increase the pressure to 8.0 torr. The electrodes are energized to ionize the gas and form a plasma of active species in the region between the electrodes. When the desired amount of $SiO_2$ and/or $Si_3N_4$ has been removed, the electrodes are de-energized, the reagent gases are purged from the chamber, and the wafer is removed.

With the relatively high pressure employed in the etching process, it is possible to utilize a greater power density than has heretofore been possible in planar reactors. This results in faster removal of the silicon dioxide than has heretofore been possible. With $3\frac{1}{2}$ inch electrodes, an energizing power of 500 watts has been found to provide good results, and with $4\frac{1}{2}$ inch electrodes a power level on the order of 500-1000 watts has been found to give good results. These power levels result in a power density on the order of 20-25 watts/cm$^3$ between the electrodes. The silicon dioxide is removed at a rate on the order of 8,000-15,000 angstroms/minute compared to only 1500 angstroms/minute with prior art techniques.

The significant increase in etching rate provided by the invention makes it feasible to process wafers on an individual basis, rather than in batches. For example, a 10,000 angstrom film of phosphorous doped silicon dioxide deposited by chemical vapor deposition can be removed from a 3 inch wafer patterned with AZ-1350 positive photoresist in approximately a 0.75 minute.

The primary gas determines the etching rate, i.e. the rate at which the silicon dioxide and/or silicon nitride is removed, and the selectivity of the etch can be adjusted by varying the amount of the secondary gas. With a reagent gas consisting only of $C_2F_6$ and no secondary gas, the selectivity over silicon is less than about 3:1. With $CHF_3$ at a pressure on the order of 0.5 torr, the selectivity is on the order of 7:1, and with the preferred concentration of 1.3 torr $CHF_3$ the selectivity is on the order of 15:1.

While the present preferred reagent gas consists of a mixture of $C_2F_6$ at a pressure on the order of 2.5 torr, $CHF_3$ at a pressure on the order of 1.3 torr and helium at a pressure on the order of 5 torr, other gas mixtures can be employed. Suitable pressure ranges include about 1-3 torr for the primary gas, 0.5-1.5 torr for the secondary gas, and 3-6 torr for the third gas, when employed.

Any pure carbon-flourine gas can be utilized as the primary etching gas. In addition to $C_2F_6$, suitable gases include $CF_4$, $C_3F_8$, $C_4F_{10}$, $C_4F_8$ and combinations thereof.

While the presently preferred secondary gas is $CHF_3$, other gases containing hydrogen can be employed. Suitable gases include hydrogen, a mixture of $CF_4$ and hydrogen, and mixtures of hydrogen with inert gases.

The etching process and gas mixture of the invention have a number of important features and advantages. They provide significantly faster etching of silicon dioxide and silicon nitride then has been possible heretofore in a planar reactor. Because of this increase in speed, wafers can be processed on an individual basis rather than in batches. The use of a high pressure in combination with a high power keeps the number of high energy species at a minimum, while providing a very high level of reactive species. In addition, the selectivity of the etch can be controlled, and photoresist breakdown is prevented.

It is apparent from the foregoing that a new and improved process and gas mixture have been provided for etching silicon dioxide and silicon nitride in a planar reactor. While only certain presently preferred embodiments have been described in detail, as will be apparent to those familiar with the art, certain changes and modifications can be made without departing from the scope of the invention as defined by the following claims.

We claim:

1. In a process for etching silicon dioxide and/or silicon nitride on a substrate in a reactor having a chamber and a pair of spaced apart generally planar electrodes, the steps of: positioning the substrate between the electrodes, admitting a primary gas consisting of a pure carbon-fluorine gas into the chamber at a pressure on the order of 1-3 torr, admitting a secondary gas containing hydrogen at a pressure on the order of 0.5-1.5 torr, and energizing the electrodes to ionize the gas and form a plasma between the electrodes.

2. The process of claim 1 wherein the primary gas consists of $C_2F_6$ at a pressure on the order of 2.5 torr, and the secondary gas consists of $CHF_3$ at a pressure on the order of 1.3 torr.

3. The process of claim 1 wherein the primary gas is selected from the group consisting of $C_2F_6$, $CF_4$, $C_3F_8$, $C_4F_{10}$, $C_4F_8$ and cominations thereof.

4. The process of claim 1 wherein the secondary gas is selected from the group consisting of $CHF_3$, hydrogen, $CF_4$ plus hydrogen, and combinations thereof.

5. The process of claim 1 wherein the electrodes are on the order of $3\frac{1}{2}$-$4\frac{1}{2}$ inches in diameter, separated by a distance on the order of 0.1-0.5 inch, and energized with a power on the order of 100-1000 watts.

6. The process of claim 1 further including the step of positioning a ring of dielectric material between the substrate and one of the electrodes to concentrate the plasma in the region between the electrodes.

7. The process of claim 1 further including the step of admitting a third gas containing helium at a pressure on the order of 3-6 torr to the chamber to inhibit the breakdown of photoresist masking on the wafer.

8. The process of claim 7 wherein the primary gas consists of $C_2F_6$ at a pressure on the order of 2.5 torr, the secondary gas consists of $CHF_3$ at a pressure on the order of 1.3 torr, and the third gas consists of helium at a pressure on the order of 5 torr.

9. In a process for etching silicon dioxide or silicon nitride on a silicon wafer in a reactor having a chamber and a pair of spaced apart generally planar electrodes, the steps of positioning the wafer between the electrodes, admitting a primary etching gas to the chamber at a pressure on the order of 1-3 torr, admitting a secondary gas to the chamber at a pressure on the order of 0.5-1.5 torr to control the rate at which the silicon dioxide and/or silicon nitride is etched relative to silicon, and energizing the electrodes with a power density on the order of 20-24 watts/cm$^3$ between the electrodes to ionize the gas and form a plasma.

10. The process of claim 9 wherein the primary etching gas consists of $C_2F_6$ at a pressure on the order of 2.5 torr, and the secondary gas consists of $CHF_3$ at a pressure on the order of 1.3 torr.

11. The process of claim 9 further including the step of admitting a third gas to the chamber at a pressure on the order of 3-6 torr to prevent the breakdown of photoresist on the wafer.

12. The process of claim 11 wherein the third gas consists of helium at a pressure on the order of 5 torr.

13. The process of claim 9 further including the step of positioning a ring of dielectric material between the wafer and one of the electrodes to enhance concentration of the plasma in the region between the electrodes.

* * * * *